United States Patent
Hartin et al.

(10) Patent No.: US 12,301,245 B2
(45) Date of Patent: May 13, 2025

(54) ITERATIVE ADC AND DAC CALIBRATION

(71) Applicant: RAYTHEON COMPANY, Waltham, MA (US)

(72) Inventors: Paul T. Hartin, McKinney, TX (US); Kyle A. Steiner, McKinney, TX (US); Robert John Casey, Celeste, TX (US); Andres Lugo, Prosper, TX (US)

(73) Assignee: Raytheon Company, Arlington, VA (US)

( * ) Notice: Subject to any disclaimer, the term of this patent is extended or adjusted under 35 U.S.C. 154(b) by 167 days.

(21) Appl. No.: 18/114,900

(22) Filed: Feb. 27, 2023

(65) Prior Publication Data

US 2024/0291498 A1 Aug. 29, 2024

(51) Int. Cl.
  *H03M 1/10* (2006.01)
(52) U.S. Cl.
  CPC .................. *H03M 1/1009* (2013.01)
(58) Field of Classification Search
  CPC ..... H03M 1/1009; H03M 1/1215; H03M 1/66
  USPC .......................................................... 341/120
  See application file for complete search history.

(56) References Cited

U.S. PATENT DOCUMENTS

| | | | |
|---|---|---|---|
| 5,594,612 A | 1/1997 | Henrion | |
| 7,038,602 B1 | 5/2006 | Moore | |
| 9,281,834 B1 | 3/2016 | Waltari | |
| 9,356,615 B1 * | 5/2016 | Ranjbar | H03M 1/1023 |
| 9,503,116 B2 * | 11/2016 | Speir | H03M 1/462 |
| 9,602,116 B1 * | 3/2017 | Le | H03M 1/1038 |
| 10,461,764 B1 | 10/2019 | Paro Filho et al. | |
| 11,196,440 B1 * | 12/2021 | Wang | H03M 1/0673 |
| 2011/0063149 A1 | 3/2011 | Kidambi | |
| 2016/0365884 A1 * | 12/2016 | Welsh | H04B 1/74 |

FOREIGN PATENT DOCUMENTS

| | | |
|---|---|---|
| EP | 3716486 A1 | 9/2020 |
| WO | 2022199114 A1 | 9/2022 |

OTHER PUBLICATIONS

International Search Report and Written Opinion of the International Searching Authority dated Mar. 14, 2024 in connection with International Patent Application No. PCT/US2023/035823, 15 pages.
Zhuang et al., "High-Purity Sine Wave Generation using Nonlinear DAC With Predistortion Based on Low-Cost Accurate DAC-ADC Co-Testing," IEEE Transactions on Instrumentation and Measurement, vol. 67, Issue 2, Feb. 2018, 9 pages.
Magstadt et al., "Accurate Spectral Testing With Impure Source and Noncoherent Sampling," IEEE Transactions on Instrumentation and Measurement, vol. 65, Issue 11, Nov. 2016, 10 pages.

* cited by examiner

*Primary Examiner* — Jean B Jeanglaude

(57) ABSTRACT

A circuit and method for calibrating ADCs and DACs generates a calibration signal by a DAC; filters spurs from the calibration signal from the DAC to generate a filtered calibration signal; calculates ADC interleave calibration factors to improve performance metrics of the ADC, responsive to the filtered calibration signal; receives the calibration signal from the DAC and calculates DAC interleave calibration factors; generates a calibration signal with improved performance metrics, responsive to the DAC interleave calibration factors received from the ADC; and repeats the process until the performance of the ADC and DAC are within a predetermined range.

20 Claims, 6 Drawing Sheets

ITERATIVE ADC AND DAC CALIBRATION

FIELD

The present disclosure generally relates to electronic circuits and more particularly to analog-to-digital converters (ADCs) and digital-to-analog converters (DACs).

BACKGROUND

High sample rate ADCs and DACs usually rely on interleaving multiple ADCs and DACs together to achieve higher effective sample rates from a lower individual sample rate. FIG. 1 shows a plurality of high sample rate ADCs, according to prior art. As shown, an analog radio frequency (RF) data signal is sampled by a plurality of ADCs ($ADC_1$ to $ADC_N$). The plurality of ADCs ($ADC_1$ to $ADC_N$) are interleaved to achieve a higher speed of sampling the analog RF signal. The ADCs are clocked by a clock at uniform intervals of the clock period. The sampled (Digital) output of the ADCs are then input to a signal processing circuit to perform the required signal processing. Although this figure shows an interleaved ADC, an interleaved DAC would look very similar.

However, offset, gain, and timing errors between the interleaved ADCs or DACs result in errors in the measured in-phase and quadrature (IQ) data and therefore spurs in the frequency spectrum. Therefore, these data converters require an interleave calibration in order to properly align the timing. Conventional calibration circuits use an optimized external signal and/or perform complex calculations using various filters to achieve the calibration of the ADCs or DACs.

SUMMARY

In some embodiments, the disclosure is directed to a circuit and a method for calibrating analog-to-digital converters (ADCs) and digital-to-Analog converters (DACs).

In some embodiments, the disclosure is directed to a circuit for calibrating ADCs and DACs. The circuit includes: a DAC for generating a calibration signal; a filter for filtering spurs from the calibration signal from the DAC to generate a filtered calibration signal; and an ADC for and calculating ADC interleave calibration factors to improve performance metrics of the ADC, responsive to the filtered calibration signal. The ADC receives the calibration signal from the DAC and calculates DAC interleave calibration factors to improve performance metrics of the DAC, the DAC generates a calibration signal with improved performance responsive to the DAC interleave calibration factors received from the ADC, and the filter repeats the filtering, the ADC repeats the calculating and the DAC repeats generating a calibration signal with improved performance, until the performance of the ADC and DAC are within a predetermined range.

In some embodiments, the disclosure is directed to a method for calibrating ADCs and DACs. The method includes: a) generating a calibration signal by a DAC; b) filtering spurs from the calibration signal from the DAC to generate a filtered calibration signal; c) calculating ADC interleave calibration factors to improve performance metrics of the ADC, responsive to the filtered calibration signal; d) receiving the calibration signal from the DAC by the ADC and calculating DAC interleave calibration factors to improve performance metrics of the DAC; e) generating a calibration signal with improved performance metrics by the DAC, responsive to the DAC interleave calibration factors received from the ADC; and f) repeating steps a to e until the performance of the ADC and DAC are within a predetermined range.

In some embodiments, the filter is an analog tunable filter. In some embodiments, the calibration signal is a fixed continuous wave (CW) tone. In some embodiments, the calibration signal is a non-CW signal with a frequency range within a bandwidth of the filter.

The performance metrics of the ADC and the DAC may be SFDR of the ADC or the DAC, respectively.

BRIEF DESCRIPTION OF THE DRAWINGS

The components in the figures are not necessarily to scale, emphasis instead being placed upon illustrating the principles of the disclosure. Like reference numerals designate corresponding parts throughout the different views. Embodiments are illustrated by way of example and not limitation in the figures of the accompanying drawings, in which.

DETAIL DESCRIPTION

In some embodiments, the present disclosure is directed to a new method and circuit for performing in-situ interleave calibration for analog-to-digital converters (ADCs) and digital-to-analog converters (DACs) at arbitrary frequencies without the need for an external source. The new approach utilizes a filtered calibration tone (signal) from an uncalibrated DAC that is then injected into the ADC to perform interleave calibration. Calibration coefficients are generated that provide an incremental improvement in ADC performance. The ADC performance metrics may be graded by various criteria such as spur-free dynamic range (SFDR) performance. This process is then iterated upon until performance improvements are negligible from run to run.

Figure 1:
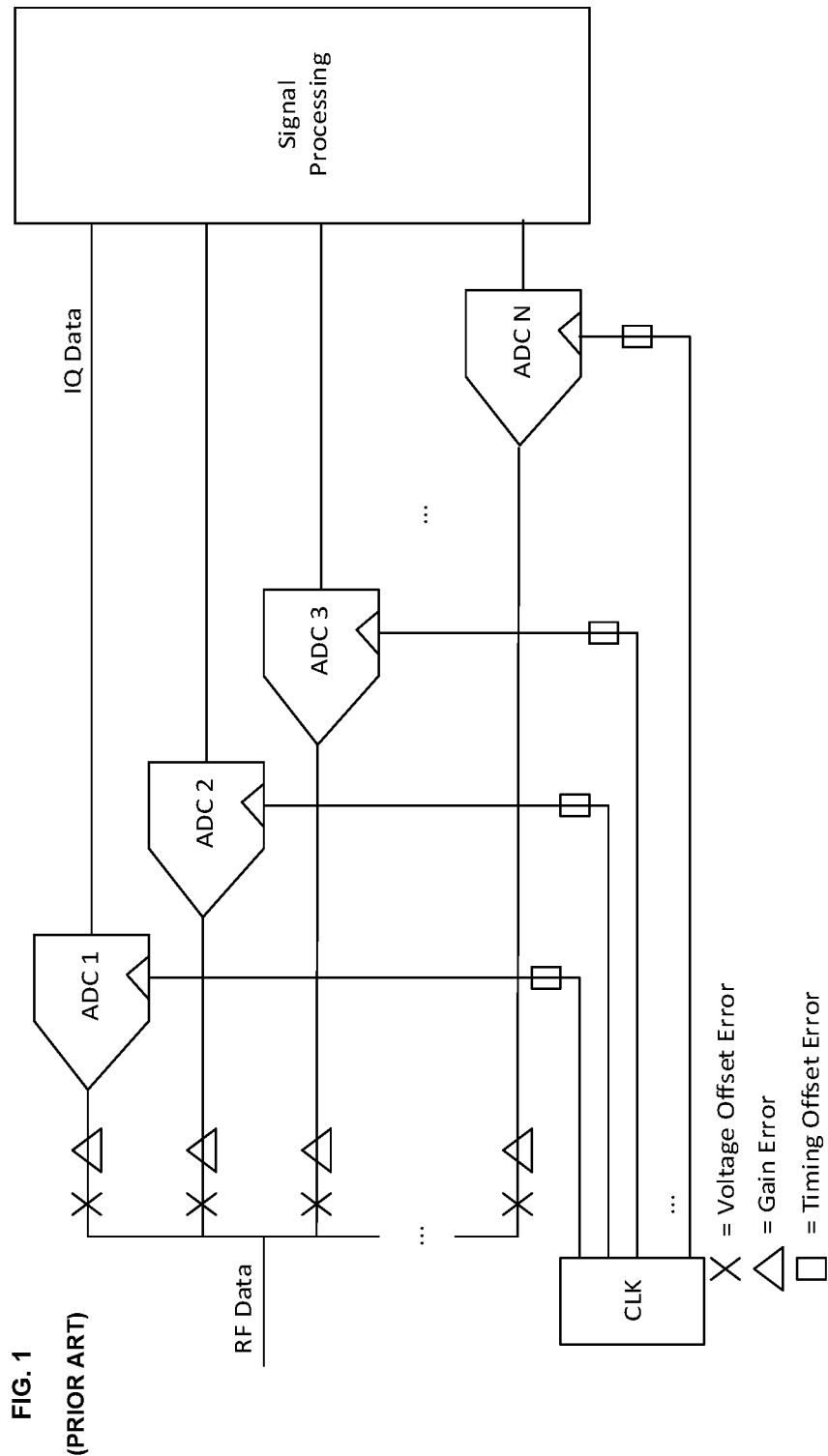
FIG. 1 shows a plurality of high sample rate ADCs, according to prior art.
Figure 2:
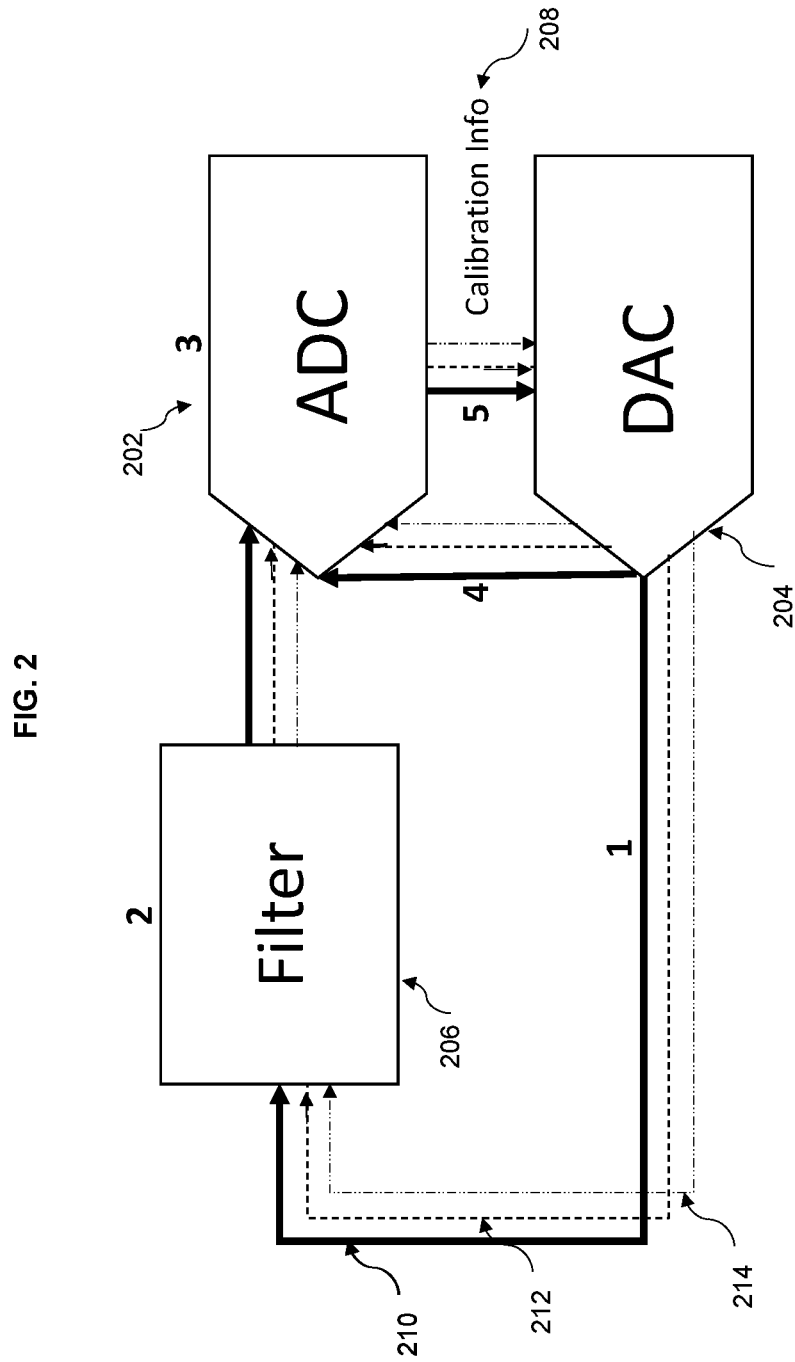
FIG. 2 is an exemplary block diagram of a circuit for calibrating an ADC and a DAC, according to some embodiments of the disclosure.

FIG. 2 is an exemplary block diagram of a circuit for calibrating an ADC and a DAC, according to some embodiments of the disclosure. As shown, an ADC 202, for example, similar to the interleaved ADCs of FIG. 1, and a DAC 204 are to be calibrated using a filter 206. In a first iteration 210, DAC 204 outputs calibration tone/signal to the filter 206, depicted by the process "1" in FIG. 2. In some embodiments, the calibration tone is a fixed continuous wave (CW) tone, but may be other types such as a non-CW signal with a frequency range within the bandwidth of the filter. Filter 206 filters out some of the spurs in the calibration tone/signal attributed to the DAC 204 (shown by process "2") to provide a less spurious calibration tone to the ADC. Filter 206 then inputs the filtered tone/signal to the ADC. ADC 202 receives the filtered tone and calculates ADC interleave calibration factors to improve ADC performance (shown by process "3"). ADC calibration factors used include, but are not limited to, DC voltage offset, gain, timing, and bandwidth.

DAC 204 then generates an unfiltered calibration tone back into the ADC (shown by process "4"). ADC receives the DAC calibration tone and calculates DAC interleave calibration factors, thus improving DAC's SFDR (shown by process "5"). DAC calibration factors used include, but are not limited to, DC voltage offset, gain, timing, and bandwidth. The above processes 1 to 5 are then repeated in a second iteration 212 to further improve the performance of the ADC 202 and DAC 204. Processes 1 to 5 are repeated for N times 214 until the performance improvements of the ADC 202 and DAC 204 are negligible or within a predetermined range determined by system requirements. One such performance metric is SFDR, as measured by the difference in amplitude from the calibration signal to the largest other frequency component in the resulting frequency spectrum from the sampled data.

In this example, once the SFDR reaches a minimum value as designated by system requirements, the calibration iterations can halt. In some cases, some frequencies show maximally improved performance after first or second iteration and therefore in those cases the number of iterations may be one or two. In some instances, rather than grading the performance against a specification, the loop may be performed through a fixed number of iterations and assumed to have reached optimal performance.

This way, Iteration 0 is a startup condition with no interleave calibration applied, but subsequent iterations improve SFDR results for both the ADC and the DAC. In some embodiments, performance can be optimized through calibration frequency selection. Some frequencies may provide fewer/lesser close-in frequency spurs around the calibration tone, which result in a better calibration on the ADC, and then subsequently, a better calibration on the DAC.

Figure 3C:
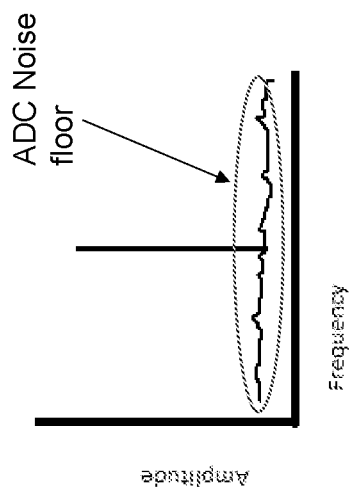
FIGS. 3A-3D depict an exemplary calibration of an ADC for one iteration, according to some embodiments of the disclosure.
Figure 3D:
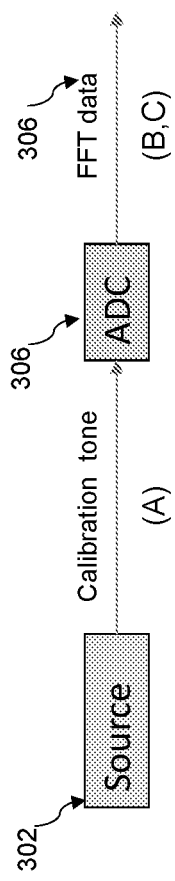
Figure 3B:
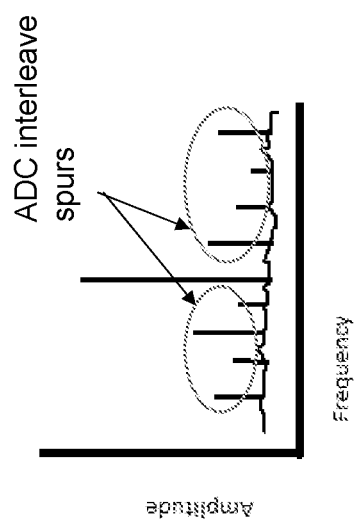
Figure 3A:
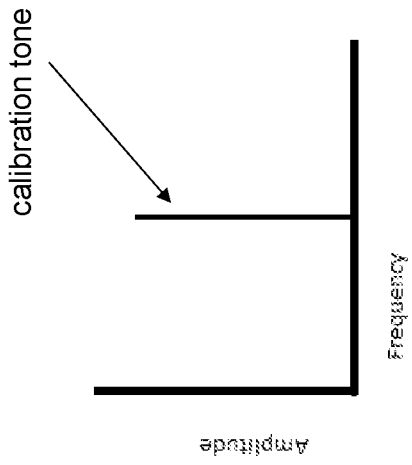

FIGS. 3A-3D depict an exemplary calibration of an ADC for one iteration, according to some embodiments of the disclosure. As shown in FIG. 3D, a signal source 302, for example, the DAC 204 of FIG. 2, provides a calibration tone (e.g., a clean or a filtered tone) to an ADC 306. Since this process is for one iteration, the calibration tone can be assumed to be a clean (spur free) signal for that particular iteration. The ADC samples the tone and calculates the interleave errors and the resulting calibration factors. In the case when SFDR is used as a performance metric, the sampled data is processed through a Fast Fourier Transform (FFT) to calculate the frequency spectrum of the calibration tone, as shown in FIG. 3A.

The interleave errors (voltage, gain, and timing) create spurs in the frequency spectrum of the output of the ADC 304. The FFT data is then processed through a correction/calibration algorithm to determine the source and magnitude of the various errors causing the interleave spurs (e.g., using a data analyzer), as shown in FIG. 3B. For example, the data analyzer analyzes the output of the ADC 304 and estimates timing and gain mismatches of each individual ADC that makes up the interleaved ADC 306. The data analyzer then corrects the timing and gain mismatches by various methods, including adjusting the adjustable timing and gain of the ADC 304, based on the estimated timing and gain mismatches, or mathematically applying offsets to the raw IQ data.

The appropriate correction/calibration factors, for example, adjusting delay, or mathematical offsets applied to the raw data, are applied to the ADC 304. As a result, the subsequent measurements of the (clean) calibration tone have reduced interleave spurs, as shown in FIG. 3C.

Figure 4A:
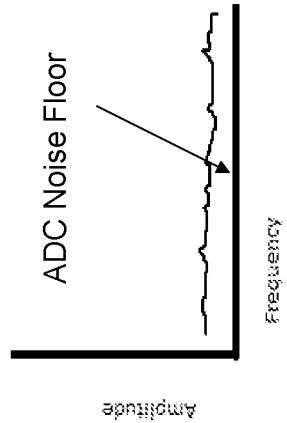
FIGS. 4A-4E depict an exemplary calibration of a DAC using an ADC for one iteration, according to some embodiments of the disclosure.
Figure 4D:
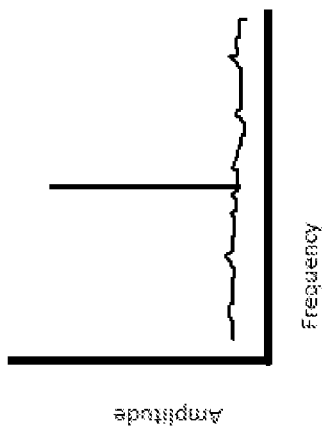
Figure 4C:
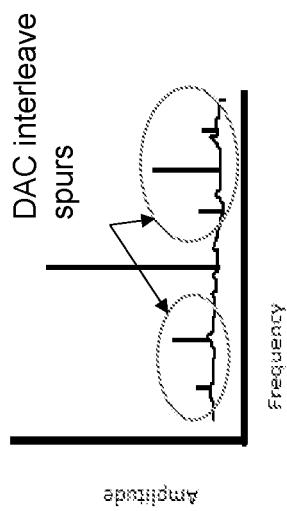
Figure 4E:
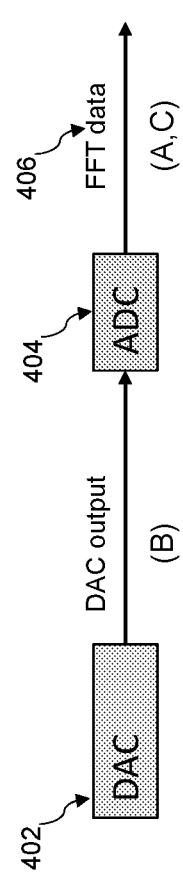
Figure 4B:
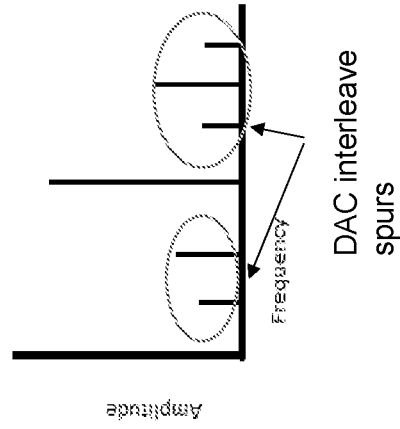

FIGS. 4A-4E depict an exemplary calibration of a DAC using an ADC for one iteration, according to some embodiments of the disclosure. As shown in FIG. 4E, an uncalibrated DAC 402 provides an uncalibrated tone (e.g., a clean or a filtered tone) to an ADC 404, as shown in FIG. 4B. ADC 404 has been previously calibrated and interleave spurs in the FFT data output out of the ADC 404 are assumed to be below the measurement noise floor, as shown in FIG. 4A. Consequently, spurs are present due to DAC interleave errors. Calibrated ADC 404 samples the tone and calculates the interleave errors and resulting calibration factors. In instances where SFDR is used as a performance metric, the sampled data is processed through an FFT of the frequency spectrum of the tone, as depicted in FIG. 4C. As shown, the DAC interleave errors (voltage, gain, and timing) are present in the output spectrum.

The FFT data is then processed through a correction/calibration algorithm to determine the source and magnitude of the various errors causing the interleave spurs, e.g., using a data analyzer). Here, the ADC is assumed to be perfect and the errors are attributed to the DAC. The appropriate correction/calibration factors, such as adjusting delay, or mathematical offsets applied to the raw data, are applied to the DAC. Subsequent measurements of the DAC output no longer have the interleave spurs, as shown in FIG. 4D.

Detailed methods of calibrating ADCs and DACs, using a clean (spur free signal) from an outside source are described in U. S. Pub. No. 20110063149A1, and U.S. Pat. No. 9,385,737B1 and 9,281,834B1, the entire contents of which are hereby expressly incorporated by reference.

Figure 5A:
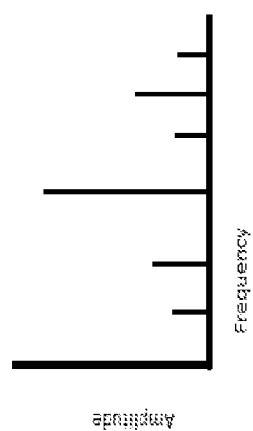
FIGS. 5A-5C illustrates operation of an exemplary filter for performing in-situ interleave calibration ADCs and DACs, according to some embodiments of the disclosure.
Figure 5B:
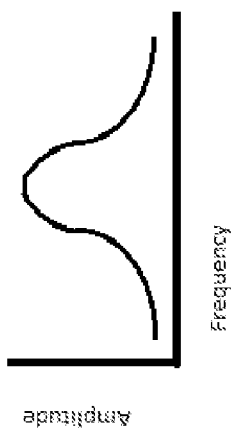
Figure 5C:
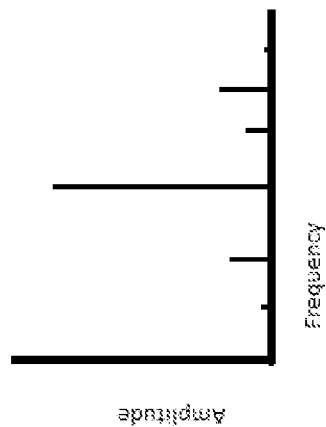

FIGS. 5A-5C illustrates operation of an exemplary filter for performing in-situ interleave calibration of ADCs and DACs, according to some embodiments of the disclosure. An analog tunable RF filter (for example, Analog Devices™ ADMV8818) may be used for this purpose. Tunability of the filter is needed if multiple calibration frequencies are desired, or if the system requires it. The uncalibrated DAC has a calibration tone and spurious products, as shown in FIG. 5A. The filter has a passband centered around the calibration tone frequency, as shown in FIG. 5B. The filtered signal has attenuated the spurious products relative to the calibration tone, as shown in FIG. 5C.

The filtered signal is now clean enough to use as a calibration signal for the ADC. The filter rejection needs to provide sufficient rejection of spurs that are far from the calibration frequency so that they are at least below the desired SFDR value. The filter bandwidth needs to be narrow enough that enough of the spurs close to the calibration frequency are attenuated such that the calibration factors improve with each iteration rather than degrade.

Figure 6:
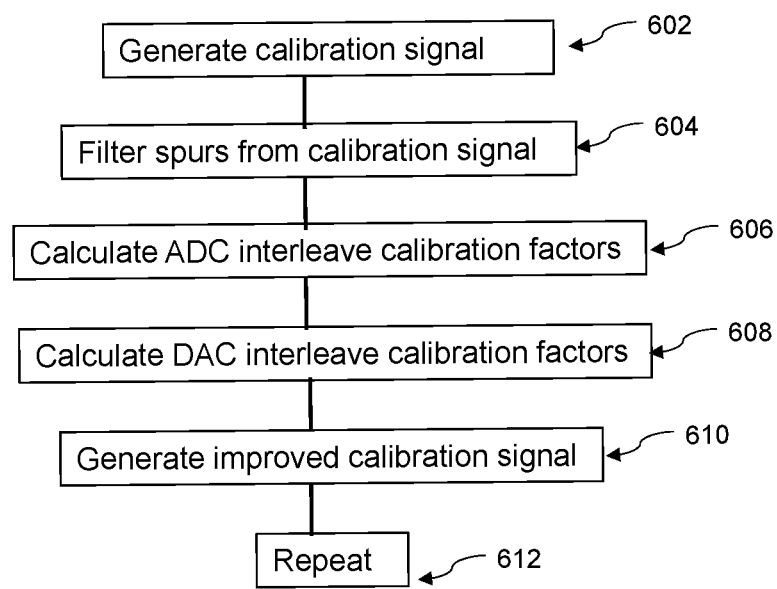
FIG. 6 is a simplified process flow for iterative calibration of an ADC and a DAC, according to some embodiments of the disclosure.

FIG. 6 is a simplified process flow for iterative calibration of an ADC and a DAC, according to some embodiments of the disclosure. As shown in block 602, a calibration signal is generated by a DAC. This generated calibration signal in the first iteration includes spurs due to offset, gain, and/or timing errors of the DAC. In block 604, spurs from the calibration signal from the DAC are filtered to generate a filtered calibration signal. The filtering may be performed by a tunable analog filter. In block 606, ADC interleave calibration factors are calculated to improve the performance metrics, such as spur-free dynamic range (SFDR) of the ADC, responsive to the filtered calibration signal received by the ADC.

The calibration signal from the DAC is also directly received by the ADC and DAC interleave calibration factors are calculated (e.g., by a processor) to improve performance (e.g., SFDR) of the DAC, in block 608. In block 610, a calibration signal with improved SFDR is then generated by the DAC, responsive to the DAC interleave calibration factors received from the ADC. As shown in block 612, the processes in blocks 604 to 610 are then repeated until the performance metrics of the ADC and the DAC are within a predetermined range. The predetermined range may be set by the system requirements, or until the iterative performance improvements of the ADC and DAC are negligible, indicating that a peak performance has been achieved.

It will be recognized by those skilled in the art that various modifications may be made to the illustrated and other embodiments of the disclosure described above, without departing from the broad inventive scope thereof. It will be understood therefore that the disclosure is not limited to the particular embodiments or arrangements disclosed, but is rather intended to cover any changes, adaptations or modifications which are within the scope and spirit of the disclosure as defined by the appended claims and drawings.

The invention claimed is:

1. A circuit for calibrating analog-to-digital converters (ADCs) and digital-to-analog converters (DACs) comprising:
a DAC configured to generate a calibration signal;
a filter coupled to the DAC and configured to filter spurs from the calibration signal to generate a filtered calibration signal; and
an ADC coupled to the filter and configured to calculate one or more ADC interleave calibration factors responsive to the filtered calibration signal;
wherein the ADC is configured to receive the calibration signal from the DAC and calculate one or more DAC interleave calibration factors;
wherein the DAC is configured to receive the one or more DAC interleave calibration factors from the ADC and to generate a calibration signal with improved performance responsive to the one or more DAC interleave calibration factors; and
wherein the filter, the ADC, and the DAC are configured to iteratively operate until one or more performance metrics are within one or more predetermined ranges.

2. The circuit of claim 1, wherein the filter is an analog tunable filter.

3. The circuit of claim 1, wherein the calibration signal is a fixed continuous wave (CW) tone.

4. The circuit of claim 1, wherein the calibration signal is a non-continuous wave (CW) tone with a frequency range within a bandwidth of the filter.

5. The circuit of claim 1, wherein the one or more performance metrics include a spur-free dynamic range (SFDR) of the ADC.

6. The circuit of claim 1, wherein the one or more performance metrics include a spur-free dynamic range (SFDR) of the DAC.

7. The circuit of claim 1, wherein the one or more ADC interleave calibration factors include DC voltage offset, gain, timing, and bandwidth of the ADC.

8. The circuit of claim 1, wherein the one or more DAC interleave calibration factors include DC voltage offset, gain, timing, and bandwidth of the DAC.

9. A method for calibrating analog-to-digital converters (ADCs) and digital-to-analog converters (DACs), the method comprising:
generating a calibration signal by a DAC;
filtering spurs from the calibration signal to generate a filtered calibration signal using a filter coupled to the DAC;
calculating one or more ADC interleave calibration factors responsive to the filtered calibration signal using an ADC coupled to the DAC;
receiving the calibration signal from the DAC by the ADC and calculating one or more DAC interleave calibration factors;
receiving the one or more DAC interleave calibration factors at the DAC from the ADC and generating a calibration signal with improved performance using the DAC responsive to the one or more DAC interleave calibration factors; and
repeating the filtering, calculating, receiving, and generating until one or more performance metrics are within one or more predetermined ranges.

10. The method of claim 9, wherein the filter is an analog tunable filter.

11. The method of claim 9, wherein the calibration signal is a fixed continuous wave (CW) tone.

12. The method of claim 9, wherein the calibration signal is a non-continuous wave (CW) tone with a frequency range within a bandwidth of the filter.

13. The method of claim 9, wherein the one or more performance metrics include a spur-free dynamic range (SFDR) of the ADC.

14. The method of claim 9, wherein the one or more performance metrics include a spur-free dynamic range (SFDR) of the DAC.

15. The method of claim 9, wherein the one or more ADC interleave calibration factors include DC voltage offset, gain, timing, and bandwidth of the ADC.

16. The method of claim 9, wherein the one or more DAC interleave calibration factors include DC voltage offset, gain, timing, and bandwidth of the DAC.

17. A circuit comprising:
a digital-to-analog converter (DAC) configured to generate a calibration signal;
a filter coupled to the DAC and configured to filter spurs from the calibration signal to generate a filtered calibration signal, wherein the filter comprises an analog tunable radio frequency (RF) filter having a passband centered around a calibration tone frequency of the calibration signal; and
an analog-to-digital converter (ADC) coupled to the filter and configured to calculate multiple ADC interleave calibration factors responsive to the filtered calibration signal;
wherein the ADC is coupled to the DAC and is configured to receive the calibration signal and calculate multiple DAC interleave calibration factors;
wherein the DAC is configured to receive the one or more DAC interleave calibration factors and to generate a calibration signal with improved performance responsive to the DAC interleave calibration factors; and
wherein the filter, the ADC, and the DAC are configured to iteratively operate until multiple performance metrics are within specified ranges.

18. The circuit of claim 17, wherein:
the ADC interleave calibration factors include DC voltage offset, gain, timing, and bandwidth of the ADC; and
the DAC interleave calibration factors include DC voltage offset, gain, timing, and bandwidth of the DAC.

19. The circuit of claim 17, wherein the multiple performance metrics comprise:
  a spur-free dynamic range (SFDR) of the ADC; and
  an SFDR of the DAC.

20. The circuit of claim 17, wherein:
  the filter is coupled directly to the DAC; and
  the ADC is coupled directly to the filter.

\* \* \* \* \*